(12) United States Patent
Gao et al.

(10) Patent No.: US 11,280,000 B2
(45) Date of Patent: Mar. 22, 2022

(54) FIXING APPARATUS AND EVAPORATION METHOD

(71) Applicant: BOE TECHNOLOGY GROUP CO., LTD., Beijing (CN)

(72) Inventors: Xinwei Gao, Beijing (CN); Xinxin Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 16 days.

(21) Appl. No.: 16/846,723

(22) Filed: Apr. 13, 2020

(65) Prior Publication Data

US 2020/0240007 A1    Jul. 30, 2020

Related U.S. Application Data

(62) Division of application No. 15/517,796, filed as application No. PCT/CN2016/074098 on Feb. 19, 2016, now Pat. No. 10,669,623.

(30) Foreign Application Priority Data

Sep. 6, 2015   (CN) .......................... 201510561608.6

(51) Int. Cl.
*C23C 14/50* (2006.01)
*C23C 14/24* (2006.01)
(Continued)

(52) U.S. Cl.
CPC ............ *C23C 14/50* (2013.01); *C23C 14/042* (2013.01); *C23C 14/24* (2013.01); *H01L 21/68757* (2013.01); *H01L 21/68785* (2013.01)

(58) Field of Classification Search
USPC .......................... 118/728, 720, 721, 504, 505
See application file for complete search history.

(56) References Cited

U.S. PATENT DOCUMENTS

| | | | | |
|---|---|---|---|---|
| 7,097,750 | B2 * | 8/2006 | Kang | C23C 14/042 |
| | | | | 118/504 |
| 10,669,623 | B2 * | 6/2020 | Gao | H01L 21/68757 |

(Continued)

FOREIGN PATENT DOCUMENTS

| | | |
|---|---|---|
| CN | 1462160 A | 12/2003 |
| CN | 101338410 A | 1/2009 |

(Continued)

OTHER PUBLICATIONS

First Chinese Office Action dated Apr. 22, 2016.
(Continued)

*Primary Examiner* — Yewebdar T Tadesse
(74) *Attorney, Agent, or Firm* — Dilworth & Barrese, LLP.; Michael J. Musella, Esq.

(57) ABSTRACT

The present disclosure discloses a fixing apparatus for fixing a substrate to be processed below a bearing base during an evaporation process, the substrate to be processed includes a base substrate, a ferromagnetic material is formed on a front surface or a back surface of the base substrate, and a magnetic field generator is disposed on a back surface of the bearing base at a location corresponding to the ferromagnetic material; the magnetic field generator is configured to generate a magnetic field so that the ferromagnetic material and the magnetic field generator are approaching to each other under an effect of the magnetic field generated by the magnetic field generator to fix a front surface of the bearing base with the back surface of the base substrate. An evaporation method is further disclosed.

8 Claims, 4 Drawing Sheets

(51) Int. Cl.
*H01L 21/687* (2006.01)
*C23C 14/04* (2006.01)

(56) References Cited

U.S. PATENT DOCUMENTS

2012/0107506 A1* 5/2012 Ukigaya ............... C23C 14/042
                                                                                          427/272
2014/0199808 A1* 7/2014 Sugimoto ............. C23C 14/042
                                                                                          438/99

FOREIGN PATENT DOCUMENTS

| CN | 103757588 A | | 4/2014 |
|----|-------------|---|--------|
| CN | 103952665 A | | 7/2014 |
| CN | 103981491 A | | 8/2014 |
| CN | 104131251 A | | 11/2014 |
| CN | 104362103 A | | 2/2015 |
| CN | 105154830 A | | 12/2015 |
| CN | 208136315 U | * | 11/2018 |
| JP | 2003173872 A | | 6/2003 |
| WO | 2012008166 A1 | | 1/2012 |

OTHER PUBLICATIONS

Second Chinese Office Action dated Oct. 8, 2016.
Third Chinese Office Action dated Jan. 17, 2017.
International Search Report dated Jun. 8, 2016 from State Intellectual property Office of the P.R. China.

* cited by examiner

Generating a magnetic field by a magnetic device so that an attraction force is generated between the ferromagnetic material and the magnetic device under an effect of the magnetic field to fix a front surface of the bearing base with the back surface of the glass substrate. — 101

FIXING APPARATUS AND EVAPORATION METHOD

CROSS-REFERENCE TO RELATED APPLICATIONS

The present application is a divisional application of U.S. patent application Ser. No. 15/517,796 filed Apr. 7, 2017, which was the National Stage of International Application No. PCT/CN2016/074098 filed Feb. 19, 2016 which claims priority from Chinese Patent Application No. 201510561608.6 filed on Sep. 6, 2015, the entire contents of each which are incorporated by reference herein.

TECHNICAL FIELD

The present disclosure relates to the field of display technology, particularly to a fixing apparatus and an evaporation method.

BACKGROUND

In the manufacturing field of Organic Light-Emitting Diode (hereinafter referred to as OLED) products, an evaporation method is used as one of the relatively matured ways.

During a manufacturing process of OLED products by using the evaporation method, it requires to fix a substrate to be processed below a bearing base. More specifically, the substrate to be processed may include a base substrate having a front surface on which display elements (including OLED, thin film transistor (TFT) and the like) are formed. For fixing the substrate, a back surface of the base substrate is fixed with a front surface of the bearing base through a double sided tape. When the substrate to be processed is fixed with the bearing base, a metallic mask plate is further disposed at a side of the substrate to be processed far away from the bearing base, then an electroluminescence material can be evaporated onto the front surface of the base substrate.

However, during practical evaporation processes, an adhesive force of the double sided tape would be reduced with time, which results in a separation of the substrate to be processed from the bearing base, and hence problems such as falling or crack of the substrate to be processed. At the same time, the double sided tape, as a consumable, need to be replaced by new ones frequently, which goes against continuous production.

SUMMARY

Embodiments of the present disclosure provide a fixing apparatus and an evaporation method, which can effectively fix a substrate to be processed with a bearing base during an evaporation process.

In order to achieve the above-mentioned objectives, embodiments of the present disclosure provide a fixing apparatus for fixing a substrate to be processed below a bearing base during an evaporation process. The substrate to be processed includes a base substrate having a front surface on which display elements are to be formed; a ferromagnetic material is formed on the front surface or a back surface of the base substrate; and a magnetic field generator is disposed on a back surface of the bearing base at a location corresponding to the ferromagnetic material.

The magnetic field generator is configured to generate a magnetic field so that the ferromagnetic material and the magnetic field generator are approaching to each other under an effect of the magnetic field to fix a front surface of the bearing base with the back surface of the base substrate.

Optionally, the ferromagnetic material is formed on the back surface of the base substrate and constitutes multiple ferromagnetic patterns located at pixel regions of the substrate to be processed.

The magnetic field generator includes multiple first magnetic structures each corresponding to at least one of the ferromagnetic patterns.

Optionally, a thickness of each of the ferromagnetic patterns is larger than or equal to 5 nm.

Optionally, each of the ferromagnetic patterns has a rectangle shape.

Optionally, the ferromagnetic patterns are disposed in one-to-one correspondence with the pixel regions, and each of the ferromagnetic patterns is located at a center of a corresponding pixel region.

Optionally, all the ferromagnetic patterns are electrically connected.

Optionally, the substrate to be processed further includes a flexible substrate disposed between the display elements and the base substrate. The flexible substrate is mixed with the ferromagnetic material in a powder form.

The magnetic field generator includes multiple first magnetic structures corresponding to the pixel regions of the substrate to be processed.

Optionally, a material of the flexible substrate is polyimide, polycarbonate or polyether sulfone.

Optionally, the substrate to be processed further includes a flexible substrate disposed between the display elements and the base substrate.

The ferromagnetic material is located at a side of the flexible substrate far away from the base substrate, and constitutes multiple ferromagnetic patterns located at the pixel regions of the substrate to be processed.

The magnetic field includes multiple first magnetic structures each corresponding to at least one of the ferromagnetic patterns.

Optionally, a material of the flexible substrate is polyimide, polycarbonate or polyether sulfone.

Optionally, a thickness of each of the ferromagnetic patterns is ranged from 5 nm to 1 mm.

Optionally, the back surface of the bearing base is provided with multiple second magnetic structures corresponding to non-pixel regions of the substrate to be processed.

The fixing apparatus further includes: each of the second magnetic structures is configured to generate a magnetic field so that a mask plate used during the evaporation process and the magnetic field generator are approaching to each other under an effect of the magnetic field generated by the second magnetic structure.

Optionally, the display elements include a thin film transistor (TFT) and an insulating layer which is formed on a side of the TFT far away form the base substrate; the ferromagnetic material is formed on a side of the insulating layer far away from the base substrate.

The ferromagnetic material constitutes multiple ferromagnetic patterns located at non-pixel regions of the substrate to be processed.

The magnetic field generator includes multiple first magnetic structures each corresponding to at least one of the ferromagnetic patterns.

Optionally, a thickness of each of the ferromagnetic patterns is larger than or equal to 5 nm.

Optionally, a width of each of the ferromagnetic patterns is smaller than a linear width of a mask plate used in the evaporation process.

Optionally, the ferromagnetic material is at least one selected from a group consisted of Fe, Co and Ni.

Optionally, the magnetic field generator is an electromagnet.

In order to achieve the above-mentioned objectives, embodiments of the present disclosure further provide an evaporation method, including fixing a front surface of a bearing base with a back surface of a base substrate by utilizing the above-mentioned fixing apparatus.

The advantageous effects of the preset disclosure lie in that: embodiments of the present disclosure provide a fixing apparatus and an evaporation method, in which the fixing apparatus is configured to fix a substrate to be processed with a bearing base during an evaporation process. The substrate to be processed includes a base substrate having a front surface on which display elements are to be formed. A ferromagnetic material is formed on the front surface or a back surface of the base substrate. A magnetic field generator is disposed at a location on a back surface of the bearing base corresponding to the ferromagnetic material. The fixing apparatus includes a magnetic field generator configured to generate a magnetic field so that the ferromagnetic material and the magnetic field generator are approaching to each other under an effect of the magnetic field to fix a front surface of the bearing base with the back surface of the base substrate. In the present disclosure, by generating a magnetic field through the magnetic field generator, the magnetic field generator and the ferromagnetic material are approaching to each other so that the substrate to be processed is fixed below the bearing base. In this way, problems such as falling and crack of the substrate to be processed during the evaporation process can be effectively avoided because the adhesive force between the magnetic field generator and the ferromagnetic material will not be reduced with processing time.

BRIEF DESCRIPTION OF THE DRAWINGS

Hereafter, the embodiments of the present invention will be described in a more detailed way with reference to the accompanying drawings, so as make one person skilled in the art be able to understand the present invention more clearly, wherein.

DETAILED DESCRIPTION

Hereafter, the technical solutions in the embodiments of the present disclosure will be described in a clearly and fully understandable way in connection with the drawings in the embodiments of the present disclosure. It is obvious that the described embodiments are just a part but not all of the embodiments of the disclosure. Based on the described embodiments herein, one person skilled in the art can obtain other embodiment(s), without any inventive work, which should be within the scope of the disclosure.

Unless otherwise defined, the technical terminology or scientific terminology used herein should have the same meaning as commonly understood by one of ordinary skill in the art to which this invention belongs. Likewise, terms like "first," "second," etc., which are used in the description and the claims of the present application for invention, are not intended to indicate any sequence, amount or importance, but distinguish various components. The phrases "connect", "connected", etc., are not intended to define a physical connection or mechanical connection, but may include an electrical connection, directly or indirectly. "On," "under," "left," "right" or the like is only used to describe a relative positional relationship, and when the absolute position of a described object is changed, the relative positional relationship might also be changed accordingly.

The First Embodiment

Figures 1, 2:
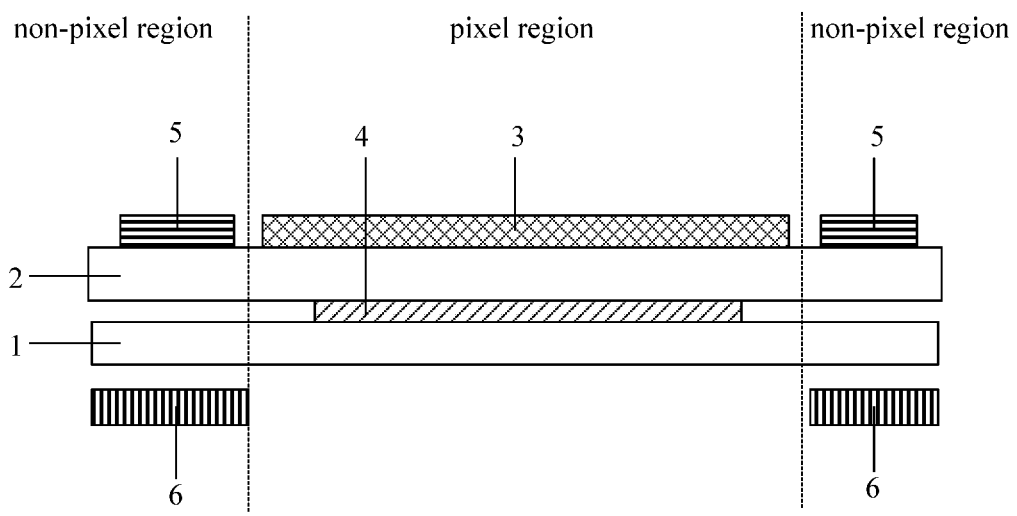
FIG. 1 is a flow chart illustrating an operation of a fixing apparatus provided by a first embodiment of the present disclosure.
FIG. 2 is a schematic diagram illustrating a first solution of fixing a substrate to be processed with a bearing base according to the first embodiment of the present disclosure.

FIG. 1 is a flow chart illustrating an operation of a fixing apparatus provided by a first embodiment of the present disclosure. As illustrated in FIG. 1, the fixing apparatus is used for fixing a substrate to be processed below a bearing base during an evaporation process. The substrate to be processed includes a base substrate 1 having a front surface on which display elements (not illustrated) are to be formed; a ferromagnetic material is formed on the front surface or a back surface of the base substrate 1; and a magnetic field generator is disposed on a back surface of the bearing base 2 at a location corresponding to the ferromagnetic material.

The operation of the fixing apparatus includes step S101, generating a magnetic field by the magnetic field generator so that the ferromagnetic material and the magnetic field generator are approaching to each other under an effect of the magnetic field generated by the magnetic field generator to fix a front surface of the bearing base with the back surface of the base substrate 1.

In the present embodiment, by pre-disposing a ferromagnetic material on the front or back surface of the base substrate 1 and then disposing a magnetic field generator on the back surface of the bearing base 2 at a location corresponding to the ferromagnetic material, a magnetic field is generated by the magnetic field generator to allow the ferromagnetic material and the magnetic field generator being approaching to each other, thereby fixing the substrate to be processed below the bearing base 2. In this way, problems such as falling and crack of the substrate to be processed during the evaporation process can be effectively avoided because the adhesive force between the magnetic field generator and the ferromagnetic material will not be reduced with processing time.

It should be explained that, as used herein, the terms "front surface" and "back surface" refer to two surfaces which are opposite to each other. With reference to the drawings, the "front surface" refers to a lower surface of an object as discussed while the "back surface" refers to an upper surface of the object as discussed.

Hereinafter several ways of fixing the substrate to be processed with the bearing base 2 in the present embodiment are discussed in more details in conjunction with the drawings.

Figure 3:
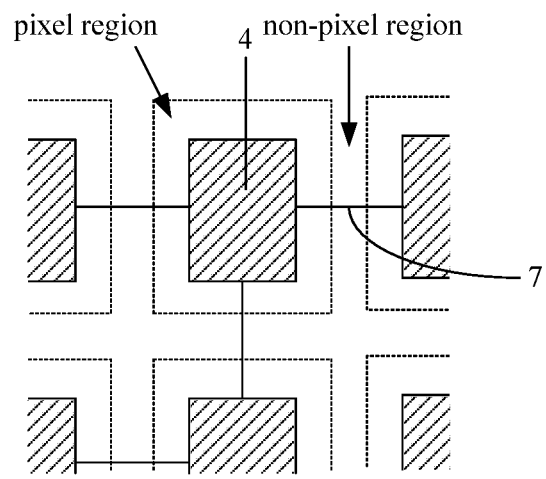
FIG. 3 is a schematic diagram illustrating the substrate to be processed in FIG. 2.

FIG. 2 is a schematic diagram illustrating a first solution of fixing a substrate to be processed with a bearing base according to the first embodiment of the present disclosure, and FIG. 3 is a schematic diagram illustrating the substrate to be processed in FIG. 2. As illustrated in FIG. 2 and FIG. 3, the ferromagnetic material is located at the back surface of the base substrate 1, and constitutes multiple ferromagnetic patterns 4 which are located in pixel regions of the substrate to be processed. The magnetic field generator includes multiple first magnetic structures 3 each corresponding to at least one of the ferromagnetic patterns 4.

In FIG. 2, by utilizing a magnetic attraction force between the first magnetic structure 3 and the corresponding ferromagnetic pattern 4, the ferromagnetic pattern 4 is contacted with the front surface of the bearing base 2 and fixed there, so as to achieve the objective of fixing the base substrate 1 right below the bearing base 2. At the same time, in order to ensure that the magnetic attraction force between the first magnetic structure 3 and the corresponding ferromagnetic pattern 4 is sufficient to fix the ferromagnetic pattern 4 with the bearing base 2, a thickness of the ferromagnetic pattern 4 is larger than or equal to 5 nm, optionally.

It should be explained that the base substrate 1 in the present embodiment can be a glass substrate.

Optionally, the magnetic field generator is consisted of an electromagnet. That is, each of the first magnetic structures 3 can be a single electromagnet, so that the magnetic attraction force between the electromagnet and the corresponding ferromagnetic pattern 4 is controllable by controlling a magnetic field intensity of the electromagnet.

During practical evaporation process, a middle portion of the substrate to be processed may be concaved due to its own gravity. In such case, the number of the electromagnet disposed corresponding to the middle portion of the substrate to be processed can be increased so as to enhance the magnetic attraction force between the electromagnet and the ferromagnetic pattern 4 located at the middle portion of the substrate to be processed; in this way, the problem that the middle portion of the substrate to be processed may be concaved is effectively solved. Of course, those skilled in the art would be appreciated that the magnetic field intensity of the electromagnet is controllable according to practical conditions during the evaporation process of the substrate to be processed, in order to ensure that the substrate to be processed is always in a flat state.

In the present embodiment, optionally, each of the ferromagnetic patterns 4 has a rectangular shape, and the ferromagnetic patterns 4 are disposed in one-to-one correspondence with the pixel regions of the substrate; for example, each of the ferromagnetic patterns is disposed at a center of a corresponding pixel region. It should be explained that, in the present embodiment, the ferromagnetic patterns 4 can be formed in a single process by using methods such as sputtering and electronic beam evaporation, or can be formed by using processes such as film forming, exposing, etching and developing.

Optionally, all the ferromagnetic patterns 4 are electrically connected through metallic leads 7. In such case, circuits are constituted among the ferromagnetic patterns 4 to effectively eliminate static electricity attached on the substrate to be processed.

It should be explained that, for the case illustrated in FIG. 2, a thickness of the ferromagnetic pattern 4 may be larger than or equal to 5 nm, in order to ensure that the magnetic attraction force between the magnetic field generator and each of the ferromagnetic patterns 4 is sufficient to fix the substrate to be processed below the bearing base 2. Furthermore, the ferromagnetic pattern 4 remained on the back surface of the base substrate 1 upon finishing the evaporation process can be removed by using etching process, in order to prevent the ferromagnetic pattern 4 from affecting the brightness of the display device as produced.

Additionally, what is similar with the substrate to be processed is that, a mask plate 6 used during the evaporation process may be deformed correspondingly due to influence factors such as its own gravity and temperature. In order to solve such technical problem, in the present embodiment, the back surface of the bearing base 2 is provided with multiple second magnetic structures 5 at locations corresponding to non-pixel regions of the substrate to be processed. The second magnetic structures 5 are configured to generate an action force with the mask plate 6 used during the evaporation process. By controlling the magnetic field intensity generated by the second magnetic structures 5 respectively, the deformation of the mask plate 6 can be effectively restrained.

In the present embodiment, besides the step S101, the operation of the fixing apparatus further includes Step 102: generating a magnetic field by the second magnetic structure 5 so that a mask plate used during the evaporation process is approaching to a corresponding second magnetic structure 5 under an effect of the magnetic field generated by the second magnetic structure 5.

It should be explained that, the first magnetic structure 3 and the second magnetic structure 5 will not interference with each other because the first magnetic structure 3 is located in the pixel region while the second magnetic structure 5 is located in the non-pixel region.

Figure 4:
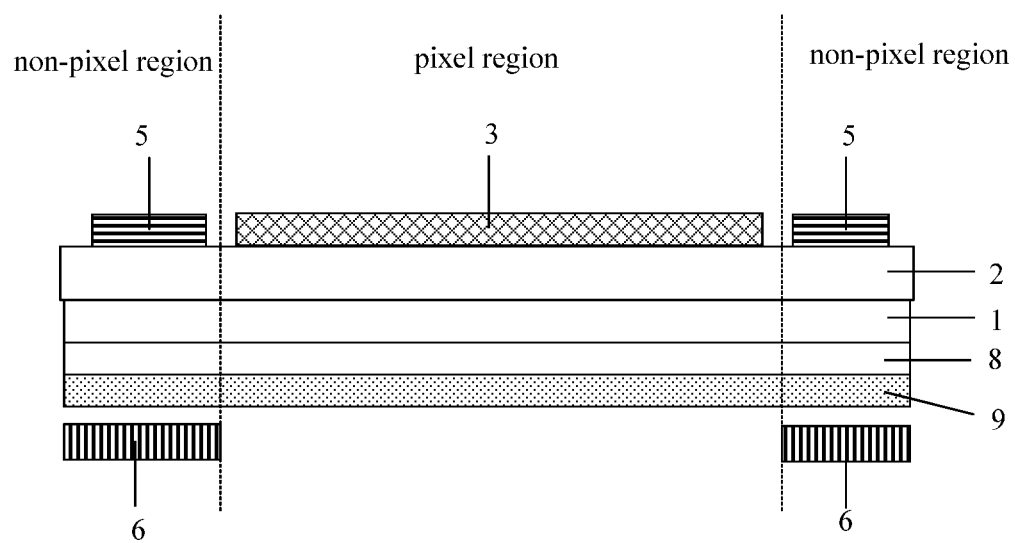
FIG. 4 is a schematic diagram illustrating a second solution of fixing a substrate to be processed with a bearing base according to the first embodiment of the present disclosure.

FIG. 4 is a schematic diagram illustrating a second solution of fixing a substrate to be processed with a bearing base according to the first embodiment of the present disclosure. As illustrated in FIG. 4, what is different from FIG. 2 is that the substrate to be processed further includes a flexible substrate applicable in a flexible display device. For example, a flexible substrate 9 can be disposed between the display elements and the base substrate 1. The flexible substrate 9 is mixed with powder ferromagnetic material. The magnetic field generator includes multiple first magnetic structures 3 corresponding to the pixel regions of the substrate to be processed. A material of the flexible substrate can be polyimide, polycarbonate or polyether sulfone.

It should be explained that, a sacrificial layer 8 can be further disposed between the base substrate 1 and the flexible substrate 9. Upon finishing the process of the substrate, the sacrificial layer 8 can be removed by using specific methods to separate the flexible substrate 9 from the base substrate 1.

In FIG. 4, a magnetic attraction force is generated between each of the first magnetic structures 3 and the flexible substrate 9 mixed with powder ferromagnetic material, so that the back surface of the base substrate 1 is contacted with the front surface of the bearing base 2 and fixed there, so as to achieve the objective of fixing the base substrate 1 right below the bearing base 2. Of course, each of the first magnetic structures 3 in FIG. 4 can be a single electromagnet, and it can ensure that the substrate to be processed is always in a flat state by respectively controlling the magnetic field intensity generated by the electromagnets.

It should be explained that, for the case illustrated in FIG. 4, a transmittance of the flexible substrate 9 would not be significantly influenced because the powder ferromagnetic material is mixed in polyimide, polycarbonate or polyether sulfone.

Of course, in the technical solution of FIG. 4, the back surface of the bearing base 2 can be provided with second magnetic structures 5 as illustrated in FIG. 2, at locations corresponding to the non-pixel regions, so as to restrain the deformation of the mask plate 6 used during the evaporation process, the particular principle of which is discussed in the preceding paragraphs and will not be repeated herein.

Figure 5:
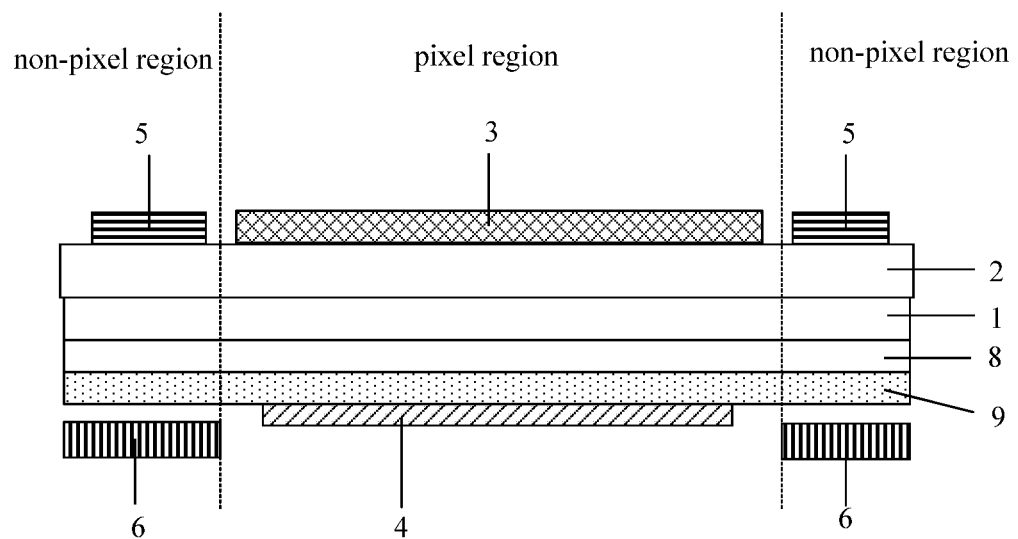
FIG. 5 is a schematic diagram illustrating a third solution of fixing a substrate to be processed with a bearing base according to the first embodiment of the present disclosure.

FIG. 5 is a schematic diagram illustrating a third solution of fixing a substrate to be processed with a bearing base according to the first embodiment of the present disclosure. As illustrated in FIG. 5, a flexible substrate 9 is disposed between the display elements and the base substrate 1, and a material of the flexible substrate 9 can be polyimide, polycarbonate or polyether sulfone. The ferromagnetic material is located at a side of the flexible substrate 9 far away from the base substrate 1 (an insulating layer is disposed between the ferromagnetic material and the display device), and constitutes multiple ferromagnetic patterns 4 which are located at the pixel regions of the substrate to be processed. The magnetic field generator includes multiple first magnetic structures 3 each corresponding to at least one of the ferromagnetic patterns 4.

In FIG. 5, by utilizing a magnetic attraction force between the first magnetic structure 3 and the corresponding ferromagnetic pattern 4, the ferromagnetic pattern 4 is contacted with the front surface of the bearing base 2 and fixed there, so as to achieve the objective of fixing the base substrate 1 below the bearing base 2. Of course, each of the first magnetic structures 3 in FIG. 5 can be a single electromagnet, and it can ensure that the substrate to be processed is always in a flat state by respectively controlling the magnetic field intensity generated by the electromagnets.

It should be explained that, in FIG. 5, the ferromagnetic pattern 4 cannot be removed by an etching process and hence may reduce an illumination intensity of the display device as produced. Thus, in order to ease the influence of the ferromagnetic pattern 4 to the illumination intensity of the display device as produced, the ferromagnetic pattern 4 may be designed with a smaller film thickness. However, an excessively thin film may result in a reduced magnetic attraction force between the first magnetic structure 3 and the ferromagnetic pattern 4, which may lead to failure of fixing the substrate to be processed below the bearing base 2. In view of the above, for the case illustrated in FIG. 5, a thickness of the ferromagnetic pattern 4 is ranged from 5 nm to 1 mm.

Of course, in the technical solution of FIG. 5, the back surface of the bearing base 2 can be provided with second magnetic structures 5 as illustrated in FIG. 2, at locations corresponding to the non-pixel regions, so as to restrain the deformation of the mask plate 6 used during the evaporation process, the particular principle of which is discussed in the preceding paragraphs and will not be repeated herein.

It should be explained that, a sacrificial layer 8 can be further disposed between the base substrate 1 and the flexible substrate 9. Upon finishing the process of the substrate, the sacrificial layer 8 can be removed by using specific methods to separate the flexible substrate 9 from the base substrate 1.

Figure 6:
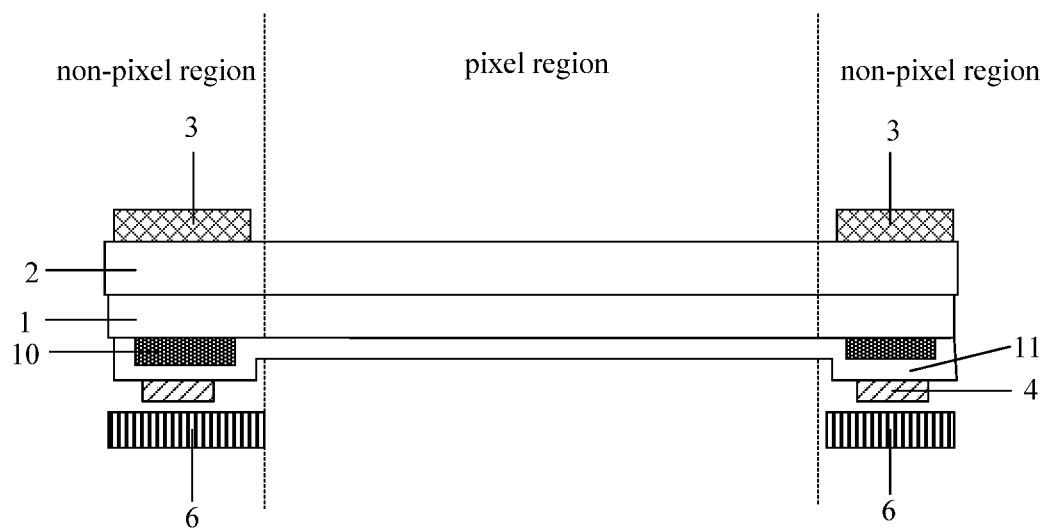
FIG. 6 is a schematic diagram illustrating a fourth solution of fixing a substrate to be processed with a bearing base according to the first embodiment of the present disclosure.
Figure 7:
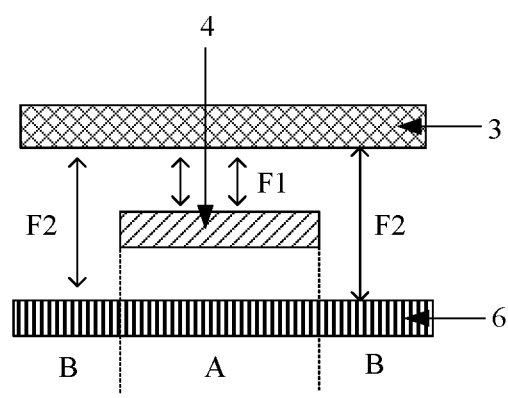
FIG. 7 is a schematic diagram illustrating relationships among a first magnetic structure, a ferromagnetic pattern and a mask plate in FIG. 6.

FIG. 6 is a schematic diagram illustrating a fourth solution of fixing a substrate to be processed with a bearing base according to the first embodiment of the present disclosure, and FIG. 7 is a schematic diagram illustrating relationships among a first magnetic structure, a ferromagnetic pattern and a mask plate in FIG. 6. As illustrated in FIG. 6 and FIG. 7, the display elements include a TFT 10 and an insulating layer 11 which is formed on a side of the TFT 10 far away from the base substrate 1. The ferromagnetic material is located at a side of the insulating layer 11 far away from the base substrate 1, and constitutes multiple ferromagnetic patterns 4 which are located at the non-pixel regions of the substrate to be processed. The magnetic field generator includes multiple first magnetic structures 3 each corresponding to at least one of the ferromagnetic patterns 4.

In FIG. 6, in order to ensure that the magnetic attraction force between the first magnetic structure 3 and the corresponding ferromagnetic pattern 4 is sufficient to fix the ferromagnetic pattern 4 with the bearing base 2, a thickness of the ferromagnetic pattern 4 is larger than or equal to 5 nm, optionally.

What is different from the technical solutions of FIG. 4 and FIG. 5 is that, the ferromagnetic patterns 4 in FIG. 6 are only located at the non-pixel regions of the substrate to be processed.

In the technical solution illustrated in FIG. 6, a width of the ferromagnetic pattern 4 is smaller than a linear width of the mask plate 6 used during the evaporation process. At the same time, a size of the first magnetic structure 3 can be made relatively larger. As illustrated in FIG. 7, by way of example, an orthographic projection of the ferromagnetic pattern 4 on the mask plate 6 covers an area A on the mask plate 6, but doesn't cover an area B on the mask plate 6. In this way, the first magnetic structure 3 can not only generate an action force F1 with the ferromagnetic pattern 4 but also generate an action force F2 with the area B on the mask plate 6. Therefore, in the technical solution illustrated in FIG. 6, the substrate to be processed can be fixed and the deformation of the mask plate 6 used during the evaporation process can be controlled merely by using the first magnetic structure 3.

It should be explained that, in the technical solution illustrated in FIG. 6, it's also possible to fix the substrate to be processed by using the first magnetic structure 3 and to control the deformation of the mask plate 6 by using the second magnetic structure 5, similarly with that of the first, second and third solutions. In such case, the first magnetic structure 3 is disposed corresponding to the area A, while the second magnetic structure 5 is disposed corresponding to the area B.

In addition, the magnetic field generator illustrated in FIG. 6 can also be an electromagnet.

Those skilled in the art would be appreciated that, all the solutions in which a bearing base 2 is fixed with a base substrate 1 by utilizing a magnetic field effect between a ferromagnetic material and a magnetic field generator through disposing the magnetic field generator on the bearing base 2 while disposing the ferromagnetic material on a front surface or back surface of the base substrate 1 should be considered as fallen within the scope of the present disclosure. Moreover, the foregoing four technical solutions are merely described by way of example without limiting the embodiments of the present disclosure thereto. Other possible technical solutions of the present disclosure are conceivable to those skilled in the art and will not be enumerated here.

In the present embodiment, the ferromagnetic material can be at least one selected from a group consisted of Fe, Co and Ni.

The Second Embodiment

The second embodiment of the present disclosure further provides an evaporation method, including: fixing a base substrate below a bearing base by using the fixing apparatus according to the first embodiment; and performing an evaporation process to the substrate to be processed. Regarding the step of fixing a base substrate below a bearing base, reference can be made to the corresponding contents in the foregoing first embodiment without repeating here.

Embodiments of the present disclosure provide a fixing apparatus and an evaporation method. During fixing a base substrate below a bearing base, by pre-disposing a ferromagnetic material on the front or back surface of the base substrate and then disposing a magnetic field generator on the back surface of the bearing base at a location corresponding to the ferromagnetic material, a magnetic field is generated by the magnetic field generator to allow the ferromagnetic material and the magnetic field generator being approaching to each other, thereby fixing the substrate to be processed below the bearing base. In this way, problems such as falling and crack of the substrate to be processed during the evaporation process can be effectively avoided because the adhesive force between the magnetic field generator and the ferromagnetic material will not be reduced with processing time.

The foregoing embodiments merely are exemplary embodiments of the disclosure and not intended to define the scope of the disclosure, and any variations or replacements which can be easily thought of by those skilled in the art in the technical scope of the disclosure shall fall within the scope of disclosure. Therefore, the scope of the disclosure shall be determined by the scope of the appended claims.

The present disclosure claims the benefits of Chinese patent application No. 201510561608.6, which was filed with the SIPO on Sep. 6, 2015 under the title of "FIXING APPARATUS AND EVAPORATION METHOD" and is fully incorporated herein by reference as part of this application.

The invention claimed is:

1. A fixing apparatus for fixing a substrate to be processed below a bearing base during an evaporation process, the substrate to be processed comprising a base substrate having a front surface on which display elements are to be formed, the fixing apparatus comprising: a ferromagnetic material being formed on the front surface or a back surface of the base substrate; and a magnetic field generator being disposed on a back surface of the bearing base at a location corresponding to the ferromagnetic material;
the magnetic field generator being configured to generate a magnetic field so that the ferromagnetic material and the magnetic field generator being approaching to each other under an effect of the magnetic field generated by the magnetic field generator to fix a front surface of the bearing base with the back surface of the base substrate;
the ferromagnetic material is located on the back surface of the base substrate, and constitutes multiple ferromagnetic patterns which are located in pixel regions of the substrate to be processed, and
the magnetic field generator comprises multiple first magnetic structures each corresponding to at least one of the ferromagnetic patterns;
the back surface of the bearing base is provided with multiple second magnetic structures corresponding to non-pixel regions of the substrate to be processed, respectively,
the fixing apparatus further comprises:
each of the second magnetic structures is configured to generate a magnetic field so that a mask plate used during the evaporation process and the magnetic field generator are approaching to each other under the magnetic field generated by the second magnetic structure.

2. The fixing apparatus according to claim 1, wherein a thickness of each of the ferromagnetic patterns is larger than or equal to 5 nm.

3. The fixing apparatus according to claim 1, wherein each of the ferromagnetic patterns has a rectangle shape.

4. The fixing apparatus according to claim 1, wherein the ferromagnetic patterns are disposed in one-to-one correspondence with the pixel regions, and
each of the ferromagnetic patterns is located at a center of a corresponding pixel region.

5. The fixing apparatus according to claim 1, wherein all the ferromagnetic patterns are electrically connected.

6. The fixing apparatus according to claim 1, wherein a thickness of each of the ferromagnetic patterns is larger than or equal to 5 nm.

7. The fixing apparatus according to claim 1, wherein the ferromagnetic material is at least one selected from a group consisted of Fe, Co and Ni.

8. The fixing apparatus according to claim 1, wherein the magnetic field generator is an electromagnet.

* * * * *